(12) United States Patent
Gavagnin et al.

(10) Patent No.: US 11,388,824 B2
(45) Date of Patent: Jul. 12, 2022

(54) COMPONENT CARRIER HAVING A THREE DIMENSIONALLY PRINTED WIRING STRUCTURE

(71) Applicant: AT&S Austria Technologie & Systemtechnik Aktiengesellschaft, Leoben (AT)

(72) Inventors: Marco Gavagnin, Leoben (AT); Markus Leitgeb, Trofaiach (AT); Jonathan Silvano de Sousa, Vienna (AT); Ferdinand Lutschounig, Ferlach (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/153,199

(22) Filed: Oct. 5, 2018

(65) Prior Publication Data
US 2019/0110367 A1    Apr. 11, 2019

(30) Foreign Application Priority Data

Oct. 6, 2017    (EP) ..................................... 17195331

(51) Int. Cl.
*H05K 1/09* (2006.01)
*H05K 1/11* (2006.01)
(Continued)

(52) U.S. Cl.
CPC ........... *H05K 3/4664* (2013.01); *B29C 64/10* (2017.08); *B33Y 10/00* (2014.12); *B33Y 80/00* (2014.12);
(Continued)

(58) Field of Classification Search
CPC .. H05K 3/4664; H05K 3/1241; H05K 1/0209; H05K 3/4647; H05K 3/368;
(Continued)

(56) References Cited

U.S. PATENT DOCUMENTS

| 4,248,921 A | * | 2/1981 | Steigerwald | ......... B23K 35/001 174/257 |
| 6,215,093 B1 | | 4/2001 | Meiners et al. | |

(Continued)

FOREIGN PATENT DOCUMENTS

| CN | 101145630 A | 3/2008 |
| CN | 102215637 A | 10/2011 |

(Continued)

OTHER PUBLICATIONS

Wroe, Jonnathan: "Introduction to Additive Manufacturing technology" www.epma.com Oct. 31, 2015 pp. 1-42; xp002779171, Shrewsburry, UK, Retrieved from the Internet:URL: https://futurerobotics.files.wordpress.com/2015/10/epma_introduction_to-additive_manufacturing_technology.pdf [retrieved on Mar. 21, 2018] *pp. 8-15,23*.

(Continued)

*Primary Examiner* — Ishwarbhai B Patel
(74) *Attorney, Agent, or Firm* — Robert A. Blaha; Smith Tempel Blaha LLC

(57) ABSTRACT

A component carrier and a method for manufacturing a component carrier is described wherein the component carrier includes a carrier body with a plurality of electrically conductive layer structures and/or electrically insulating layer structures and a wiring structure on and/or in the layer structures where the wiring structure is at least partially formed as a three-dimensionally printed structure.

16 Claims, 2 Drawing Sheets

(51) Int. Cl.

| | | |
|---|---|---|
| *H05K 1/18* | (2006.01) | |
| *H05K 3/46* | (2006.01) | |
| *H05K 3/10* | (2006.01) | |
| *H05K 3/36* | (2006.01) | |
| *H05K 1/02* | (2006.01) | |
| *B29C 64/10* | (2017.01) | |
| *B33Y 99/00* | (2015.01) | |
| *H05K 3/12* | (2006.01) | |
| *B33Y 80/00* | (2015.01) | |
| *B33Y 10/00* | (2015.01) | |
| *B33Y 70/00* | (2020.01) | |

(52) U.S. Cl.
CPC ............ *B33Y 99/00* (2014.12); *H05K 1/0209* (2013.01); *H05K 1/115* (2013.01); *H05K 1/119* (2013.01); *H05K 3/108* (2013.01); *H05K 3/1241* (2013.01); *H05K 3/368* (2013.01); *H05K 3/4647* (2013.01); *H05K 3/4682* (2013.01); *B33Y 70/00* (2014.12); *H05K 1/09* (2013.01); *H05K 1/092* (2013.01); *H05K 1/11* (2013.01); *H05K 1/111* (2013.01); *H05K 1/112* (2013.01); *H05K 1/181* (2013.01); *H05K 1/185* (2013.01); *H05K 2201/0323* (2013.01); *H05K 2201/0338* (2013.01); *H05K 2203/107* (2013.01); *H05K 2203/1131* (2013.01)

(58) Field of Classification Search
CPC ........ H05K 3/108; H05K 1/115; H05K 1/119; H05K 3/4682; H05K 2203/107; H05K 1/185; H05K 1/181; H05K 2201/0338; H05K 2201/0323; H05K 1/09; H05K 2203/1131; H05K 1/0203; H05K 1/0204; H05K 1/0206; H05K 1/0284; H05K 1/0313; H05K 1/0366; H05K 1/092; H05K 1/11; H05K 1/111; H05K 1/112; H05K 1/18; H05K 1/182; H05K 1/183; H05K 2201/06; H05K 2201/09036; H05K 2201/095; H05K 2201/09509; H05K 2201/09518; H05K 2201/09545; H05K 2201/10431; H05K 2201/10439; H05K 2201/10674; H05K 2201/10977; B33Y 99/00; B33Y 10/00; B33Y 80/00; B33Y 70/00; B29C 64/10

See application file for complete search history.

(56) References Cited

U.S. PATENT DOCUMENTS

| | | | | |
|---|---|---|---|---|
| 2005/0067177 | A1* | 3/2005 | Saito ................ | H01L 21/4857 174/521 |
| 2009/0250253 | A1* | 10/2009 | Park .................. | H05K 3/4658 174/258 |
| 2009/0266582 | A1 | 10/2009 | Sakurai et al. | |
| 2009/0321045 | A1 | 12/2009 | Hernon et al. | |
| 2010/0109688 | A1 | 5/2010 | Eldridge et al. | |
| 2011/0244636 | A1* | 10/2011 | Kondo ............. | H01L 23/49822 438/127 |
| 2011/0253435 | A1* | 10/2011 | Huang ............... | H05K 1/0284 174/258 |
| 2011/0304016 | A1* | 12/2011 | Nakamura .......... | H01L 21/4857 257/532 |
| 2014/0102767 | A1 | 4/2014 | Kang et al. | |
| 2014/0231266 | A1* | 8/2014 | Sherrer ............. | B22D 19/00 205/136 |
| 2014/0326484 | A1* | 11/2014 | Tajima .............. | H05K 1/0216 174/250 |
| 2015/0036305 | A1* | 2/2015 | Nanjo ............... | H05K 3/4679 361/761 |
| 2015/0096788 | A1 | 4/2015 | Wilkins | |
| 2015/0173203 | A1 | 6/2015 | Din | |
| 2015/0201499 | A1* | 7/2015 | Shinar ................ | B29C 64/182 425/132 |
| 2015/0201500 | A1* | 7/2015 | Shinar ................ | H05K 3/125 425/132 |
| 2015/0237762 | A1 | 8/2015 | Holt et al. | |
| 2016/0278200 | A1 | 9/2016 | Costes | |
| 2016/0345875 | A1 | 12/2016 | Schimmoeller et al. | |
| 2017/0374739 | A1* | 12/2017 | Warwick ............. | H05K 3/368 |
| 2018/0160549 | A1* | 6/2018 | Chen ................. | H05K 1/111 |
| 2019/0110367 | A1 | 4/2019 | Gavagnin et al. | |

FOREIGN PATENT DOCUMENTS

| | | |
|---|---|---|
| CN | 103140026 A | 6/2013 |
| CN | 103237285 A | 8/2013 |
| CN | 105376933 A | 3/2016 |
| DE | 10 2007 015 399 A1 | 10/2008 |
| DE | 10 2007 050 405 A1 | 4/2009 |
| DE | 10 2014 201 121 A1 | 7/2015 |
| DE | 10 2014 201 306 A1 | 7/2015 |
| DE | 10 2016 218 968 A1 | 4/2018 |
| EP | 3468312 A1 | 4/2019 |
| GB | 2 538 522 A | 11/2016 |
| JP | 2007150050 A | 6/2007 |
| WO | WO2008102266 A2 | 8/2008 |
| WO | WO2014173419 A1 | 10/2014 |
| WO | 2015028716 A1 | 3/2015 |
| WO | 2017003128 A1 | 1/2017 |
| WO | WO2017001369 A1 | 1/2017 |
| WO | WO2017055599 A1 | 4/2017 |

OTHER PUBLICATIONS

Whittaker, Paul; "Metal Additive Manufacturing", ipmd.net, Sep. 30, 2014 (Sep. 30, 2014), pp. 1-90, XP002779172, Shrewsbury, UK Retrieved from the Internet:URL:http://www.pm-review.com/powder-metallurgy-review-archive/powder-metallurgy-review-vol-3- no-2-summer-2014/ [retrieved on Mar. 21, 2018] *pp. 43,44 *.

Anon: "Metal powders for additive manufacturing", Sandvik Osprey Ltd., Sep. 30, 2010 (Sep. 30, 2010), XP002779173, Retrieved from the Internet:URL:https://www.materials.sandwik/globalassets/global/downloads/products_downloads/metal_powders/s-po009-ps-eng-09.2010.pdf [retrieved on Mar. 21, 2018] *the whole document*.

Office Action in Application No. 201811169121.3; pp. 1-8; dated Nov. 27, 2020; China National Intellectual Property Administration, Beijing, China.

English Translation of Office Action in Application No. 201811169121.3; pp. 1-4, dated Nov. 27, 2020; China Intellectual Property Administration, Beijing, China.

English Translation of Search Report in Application No. 201811169121.3; dated Nov. 27, 2020; China Intellectual Property Administration, Beijing, China.

Simon, V.; Communication Pursuant to Article 94(3) EPC in Application No. 17 195 331.8; pp. 1-7; dated Mar. 24, 2021; European Patent Office; POstbus 5818; 2280; HV Rijswijk, Netherlands.

Second Office Action in Application No. 201811169121.3; pp. 1-6; dated Nov. 27, 2020; China National Intellectual Property Administration, No. 6, Xitucheng Lu, Jimenqiao Haidian District, 100088, Beijing, China.

English Translation of Second Office Action (cover) in Application No. 201811169121.3; pp. 1-3, dated Sep. 8, 2021; China Intellectual Property Administration, No. 6, Xitucheng Lu, Jimenqiao Haidian District, 100088, Beijing, China.

Third Office Action in Application No. 201811169121.3; pp. 1-10; Apr. 7, 2022; China National Intellectual Property Administration; No. 6, Xitucheng Lu, Jimenqiao Haidian District, Beijing City, 100088, China.

English translation of the cover page of the Third Office Action in Application No. 201811169121.3; pp. 1-3; Apr. 7, 2022; China

(56) References Cited

OTHER PUBLICATIONS

National Intellectual Property Administration; No. 6, Xitucheng Lu, Jimenqiao Haidian District, Beijing City, 100088, China.

* cited by examiner

COMPONENT CARRIER HAVING A THREE DIMENSIONALLY PRINTED WIRING STRUCTURE

TECHNICAL FIELD

The invention relates to a component carrier having a three dimensionally (3D) printed wiring structure. Further, the invention relates to a method of manufacturing a component carrier having a three dimensional (3D) printed wiring structure.

TECHNOLOGICAL BACKGROUND

Conventional component carriers comprise wiring structures which are formed by plating a wiring structure material on a part of the component carrier and afterwards remove parts of the wiring structure material which will not be used. Important for the quality of the wiring structure and for the connection of the materials is the material of the wiring structure itself and the material onto which the wiring structure is applied on. It is further important to provide a high accuracy of the formed shape of the wiring structure.

With continuous demand for precise wiring structures and other applicable component carrier materials and with increasing complexity and increasing demand for easier and simpler manufactured component carriers, there is still room for improved component carriers and therefore improved wiring structures.

SUMMARY

There may be a need to provide a component carrier having a wiring structure which is easy producible and simultaneously provides more flexibility in the arrangement of the wiring structure and the electrical connections formed by the wiring structure.

According to a first aspect of the invention there is provided a component carrier, wherein the component carrier comprises a carrier body. The carrier body comprises a plurality of electrically conductive layer structures and/or electrically insulating layer structures. The component carrier further comprises a wiring structure on and/or in the layer structures and being at least partially formed as a three-dimensionally printed structure.

According to another aspect of the invention, a method for manufacturing a component carrier is provided. The method comprises providing a carrier body comprising a plurality of electrically conductive layer structures and/or electrically insulating layer structures and forming a wiring structure on and/or in the layer structures at least partially by three-dimensionally printing.

Overview of Embodiments

In the context of the present document, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane. The component carrier comprises the carrier body which is comprised of different layer structures, i.e. the electrical insulating and electrical conductive layer structures. The different layer structures may be arranged, such that the order of the electrical insulating layer structure and the electrical conductive layer structure are alternating. For example the carrier body may have layer structure starting with the electrical conductive layer structure followed by an electrical insulating layer structure further followed by an electrical conductive layer structure such that the stack of the component carrier is formed.

In the context of the present document, the term "wiring structure" may particularly denote a single thin wire which may be used for electrically connecting components of the component carrier. The wiring structure may be used for providing an electrical connection between components or for transferring signals via the wiring structure from one end of the wiring structure to the other end. Further, the wiring structure may be used to electrically connect other electrically conductive lines. The wiring structure may comprise any geometry such as asymmetric, fractal or symmetric such as a circular, in particular the wiring structure may comprise an oval or a rectangular cross section.

In the context of the present document, the term "three dimensionally printed structure" may particularly denote a structure formed by means of a three dimensionally printing process. The three dimensional structures are formed under computer control to create a 3D structure. During the three dimensional printing procedure, the 3D printed structure may be formed layer by layer. In particular, three dimensionally printing denotes for example 3D printing with powder materials, 3D printing by meltable materials, 3D printing by fluid materials. Another process using a printing material in powder form is selective laser sintering/melting (SLS/SLM). Furthermore, if the powder is delivered only locally (e.g. with a nozzle) the printing method is called LENS (Laser Engineered Net Shaping). A further process using printing material in powder form is electron beam melting (EBM, or also called electron beam additive manufacturing EBAM). 3D printing by meltable materials may particularly denote fused filament fabrication (FFF) or fused deposition modeling (FDM). Melted materials which will be used for this process may be in particular plastics like ABS or PLA. 3D printing by fluid materials may particularly denote the manufacturing process which is working on the basis of fluidic UV-sensitive plastics (photopolymer, also other materials which are sensitive of other wavelength may be used). In particular, the 3-D printing with fluid materials may denote the so-called stereolithography (SLA). During this process the 3-D structure is also formed layer by layer. 3D printing by transferring the material from a foil (e.g. copper foil) via laser pulses, may denote the so-called laser induced forward transfer (LIFT) method. All mentioned process and/or methods may be used for 3D printing the three dimensionally printed structure.

It is mentioned that the term "layer structures" is used in this document representative for the plurality of electrically conductive layer structures and the electrically insulating layer structures.

In an embodiment, the component carrier may comprise a component mounted on and/or embedded in the carrier body. The component may be an electrical component or device for performing different functions depending on the application into which the component carrier is attached. The component may be mounted on and/or embedded in at least one of the plurality of electrically insulating layer structures and/or mounted on and/or embedded in at least one of the plurality of electrically conductive layer structures.

In an embodiment, the wiring structure may be configured to form an electronic and/or thermal connection with the electronic component. The wiring structure may be configured to form an electronic connection with the above mentioned component. The electronic connection may be used for transferring electrical signals from one end of the wiring structure to the other end of the wiring structure. Further, the component carrier comprises at least two components, wherein the wiring structure is configured to form an electronical connection between the at least two components. The wiring structure may also be used to form an electrical connection between electrical connections from one single component. For example, different pins of a microcontroller (or of a integrated circuit) may be connected by the wiring structure. Further, the wiring structure may form an electronical circuit. The electronical circuit may be able to perform simple and/or complex operation, like transferring signals, detecting signals, amplifying signals, performing computation, transferring data from one place to another. The electronical circuit may comprise of at least one component, in particular of a plurality of electrical components (resistors, transistors, capacitors, inductors, diodes) which are connected to each other by the wiring structure. Forming the circuit by means of the wiring structure which is formed as a three dimensionally structure may have the advantage that the manufacturing may be simplified. Further, the flexibility in the design of an electronical circuit may be increased. Particularly, structuring with different heights on the same conductive layer may be achieved. The electronical circuit may be an analog circuit, a digital circuit or a mixed signal circuit. Furthermore, the wiring structure may be configured to form a thermal connection with the electronic component, such that either heat may be transferred by the thermal connection or heat and electronical signals may be transferred by the thermal and electrical connection.

In an embodiment, the wiring structure comprises at least one protrusion for forming an electrical and/or thermal contact. The protrusion protrudes from regions of the wiring structure surrounding the protrusion. For example, the wiring structure may be a line extending on at least one of the layer structures and the protrusion is formed on at least one side of the wiring structure and extends in a direction perpendicular with respect to the extending direction of the wiring structure. The wiring structure may comprise more than one protrusion.

In an embodiment, the wiring structure is at least partially surrounded by an encapsulation, wherein the protrusion extends through the encapsulation for forming an electrical contact. The encapsulation may cover the wiring structure completely or the encapsulation may cover the wiring structure on at least one side of the wiring structure. For example, the wiring structure may be printed on/in a layer structure. The surface of the wiring structure which is not in contact with the layer structure may be covered by the encapsulation. The encapsulation may be one of the layer structures and/or the encapsulation may be made of a resin, dielectric or plastic for insulating the wiring structure from the surrounding. The protrusion may extend through the encapsulation such that the protrusion may not be isolated and may be able to form an electrical contact to a further wiring structure or to any other electrically conductive element (e.g. a component).

In an embodiment, a cross section of the wiring structure perpendicular to a current propagation direction may have, for example and without any loss of generality in the geometry, has a shape of at least one of the group comprising of a rectangular shape a fractal shape, a circular shape, an oval shape, and a trapezoid shape. The cross section of the wiring structure may be printed in a precise manner for forming the desired rectangular shape with in particular 90° vertical walls in order to overcome failures during a conventional etching process of the wiring structures whereas typical under the mask etch processes do not allow the formation of 90° vertical walls. In fact, any degree in any geometry may be allowed for the process. The current propagation direction may be the direction in which the current flows through the wiring structure. Hence, the cross section of the wiring structure may extend in a plane perpendicular to the layer structures, when the wiring structure extends along the layer structures. This means, when the wiring structure extends in a plane parallel to the layer structures the cross section extends in a plane perpendicular to the layer structures (or vice versa).

According to a further exemplary embodiment, the cross section of the wiring structure perpendicular to a current propagation direction may have an L-shape a U-shape or a comb-shape. The comb shape of a wiring structure is defined by a base of the wiring structure (e.g. arranged on or in the layer structure) from which a plurality of spikes or rails (e.g. extending in or perpendicular to the current propagation direction) of the wiring structure extends, in particular along the stacking direction of the layer structures. Hence, the L-shape, U-shape or comb-shape of the wiring structure are advantageous for transmitting signals having high frequencies.

In an embodiment, the wiring structure is formed extending along a stacking direction of the plurality of layer structures. As described above the layer structures of the component carrier may be arranged as a stack such that the different layer structures are arranged on top of each other, i.e. layer over layer. Therefore, the term "stacking direction" may particularly denote the direction along which the stapled layers are stapled with respect to each other. The stacking direction may be an extending direction through the plurality of layer structures.

In an embodiment, the wiring structure is formed such that the wiring structure extends perpendicular with respect to a stacking direction of the plurality of layer structures. The perpendicular extension with respect to the stacking direction may be an extending direction along at least one of the plurality of layer structures.

In an embodiment, the wiring structure may comprise different cross sections, in particular in a stacking direction of the plurality of layer structures and/or, perpendicular with respect to a stacking direction of the plurality of layer structures. The wiring structure may comprise different cross sections in a direction of a plane extending in parallel with the plurality of layer structures and/or the wiring structure may comprise different cross sections in a direction of a plane extending perpendicular to the layer structures. Hence, the wiring structure may comprise different thicknesses in the plane parallel and/or perpendicular to the plurality of layer structures. With 3-D printing different thicknesses may be realized in a simple manner.

In an embodiment, the wiring structure may be formed from at least one material component of the group consisting of copper, aluminum, steel, and titanium. Due to the use of different materials different functions may be applied to the wiring structure and to the formed electronic circuit. Different materials may be applied on/in at least one layer structure such that different materials are 3-D printed on one layer structure. It may also be possible to apply different materials to different layer structures. For example the electronically conductive layer structure is a copper layer structure and the wiring structure which will be printed on/in the copper layer structure is another metal material (e.g. gold, steel, titanium). After 3-D printing the copper layer structure may be etched and removed but not the 3-D printed wiring structure on/in the copper layer structure. On the other side the layer structure may be formed of a material, different than copper, and the printed wiring structure may be a copper material.

In an embodiment, the wiring structure may be formed on opposing surfaces of at least one of the layer structures. In particular, the wiring structure is formed on opposing surfaces of at least one electrically conductive layer structure and/or is formed on opposing surfaces of at least one electrically insulating layer structure. According to this embodiment, layer structures may be formed which comprise a structured surface, in particular which comprise a structured surface on both sides of one layer structure.

In an embodiment, the wiring structure is directly printed on at least one of the plurality of the layer structures. The directly printing may particularly denote that no adhesive or other layers are arranged between the wiring structure and the layer of the carrier body on which the wiring structure is printed. The wiring structure may be directly printed on at least one of the electrically insulating layer structures for forming an electrically conductive contact on and/or in an electrical insulating layer structure. Furthermore, the wiring structure may be directly printed on/in an electrically conductive layer structure for continuing the electrical conductivity of the layer structure by the wiring structure such that an electrical contact for other parts and/or components may be formed.

In an embodiment, at least one of the layer structures comprises a recess, wherein the wiring structure is arranged in the recess. The recess may be formed by drilling, milling or etching. The recess may be adapted to the shape, in particular the cross section, of the wiring structure. The wiring structure may be directly formed in the recess by three dimensionally printing. It may also be possible that the at least one of the layer structure is manufactured in such a manner that the recess is formed during the manufacturing (e.g. by etching) such that the recess must not be formed by drilling or milling.

In an embodiment, the component carrier further comprises a foil, in particular a conductive foil, formed on at least one of the layer structures such that the conductive foil covers the wiring structure. For example, the uppermost and/or the lowest layer structure of the carrier body may be the copper foil. When printing the wiring structure on a conductive layer structure which is a copper foil two layer structures may be formed using the same material. This may have the advantage that the warpage of the copper may be avoided. Further, by 3-D printing the wiring structures on the copper foil, a higher adhesion between the wiring structure and the material onto which the wiring structure is printed may be achieved. For example, the wiring structure may be printed on the copper foil and afterwards the wiring structure may be arranged in a layer structure comprising the recess. Hence, the copper foil covers the wiring structure on the upper side and the lower side of the wiring structure may be arranged in the recess. The copper foil may be also "bare", which means without having a dielectric beneath. This allows to cure the printed structure, e.g. by high temperature or UV light, without risking to damage the dielectric layer. After the curing is accomplished, the copper foil with the 3D printed structures may be laminated together with the dielectric and afterwards continue with PCB-compatible process steps.

In an embodiment, the component may be selected from a group consisting of an electronic component, an electrically non-conductive and/or electrically conductive inlay (such as a metal inlay, preferably comprising copper or aluminum), a heat transfer unit (for example a heat pipe), a light guiding element (for example an optical waveguide or a light conductor connection), an energy harvesting unit, an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, an accumulator, a switch, a camera, an antenna, a magnetic element, a further component carrier and a logic chip, and an energy harvesting unit. Combinations thereof may also be possible. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the at least one electrically conductive layer structure may comprise at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the at least one electrically insulating layer structure comprises at least one of the group consisting of resin, in particular reinforced or non-reinforced resin, for instance epoxy resin or Bismaleimide-Triazine resin, FR-4, FR-5, cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present document, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. These vias may be formed by three dimensionally printing. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present document, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment the component carrier may be configured as a laminate-type component carrier. In such an embodiment, the component carrier is a compound of multiple layer structures which are stacked and connected together by applying a pressing force, if desired accompanied by heat.

In the following exemplary embodiments of the method will be described.

According to a further exemplary embodiment of the method, the three-dimensionally printing may comprise the steps of applying a printing material to an application device, melting the printing material in the application device, and applying the melted printing material on and/or in the layer structures for forming at least one layer of the wiring structure (which is comprised of the melted (wiring structure) material). According to this embodiment for the manufacturing of the 3-D printed wiring structure meltable materials may be used. The material may be applied to a 3-D printer comprising a printhead functioning as the application device. The printhead may be a heatable extruder into which the material is supplied. Inside the extruder the material is melted, such that the material can be transferred through the extruder (e.g. an extruder nozzle) to a structure onto which the melted material is to be applied, e.g. at least one of the layer structures. The application device and the carrier body can be moved with respect to each other. After consolidating (e.g. solidifying curing) the applied layer of the wiring structure, subsequently a further layer of the wiring structure may be formed. The number of the formed layers of the wiring structure depends on the size, in particular the height, of the wiring structure. For example, a formed layer may have a thickness of 50 µm. The wiring structure may have a thickness of 200 µm. Hence, four layers may be formed on top of each other. For example, the application device may have a high resolution such that single layers of a thickness of approx. 1 µm to 16 µm may formed. During the manufacturing process more than one application devices may be used for applying different materials or for simultaneously manufacturing more than one wiring structure. According to this embodiment, it may be possible to form simultaneously more than one wiring structures on a common layer structure. Further, two wiring structures may be formed on/in two different layer structures (which means one wiring structure may be formed on/in the electrically conductive layer structure and the other wiring structure may be formed on/in the electrically insulating layer structure) before the component carrier is formed, in particular before the laminating of the different layer structures. The used meltable material may be made of an electrically conductive material, e.g. copper, or it may be enriched with electrically conductive material components.

According to a further exemplary embodiment of the method, the three-dimensionally printing may comprise the following steps: applying a printing material, in particular a powder material on and/or in the carrier body, and consolidating (e.g. solidifying) the applied printing material for forming at least one layer of the wiring structure. The term "consolidating" may particularly denote any step or activity for bringing the layer of printed material in a solid state, wherein the solid state is the state of at least one layer structure made of the printing material. For example consolidating may comprise at least one of the following: adhering, gluing, curing, tempering, solidifying, melting and hardening, or hardening the printing material for forming at least one layer of the wiring structure. The forming of the at least one layer of the wiring structure may be performed by applying an adhesive to the at least one layer of the wiring structure. The adhesive adheres the single particles of the powder material together such that a respective layer is formed. The adhesive may be applied by a printhead to the powder layer. The adhesive (binder) may be a fluidic adhesive. During the 3-D printing with powder, the first (lowermost) layer is applied with the fluidic adhesive on the powder layer by the printhead. The 3-D printer prints the 3-D picture of the first layer on the powder bed and adheres the material particles together. After that, a further and thin powder layer is applied on the first layer and the procedure is repeated with a second layer. Thus, a 3-D model of the wiring structure is created by adhering layer to layer in a powder bed. The 3-D structure is growing from the bottom. Therefore, the powder bed is lowered about the height of a powder layer. Powder and adhesive may be comprised of different materials. For example, plastic powder, a ceramic powder, glass powder or other metal pulverulent materials may be used. It may also be possible to use metal as a powder material, for example copper powder for 3D printing wiring structures. The 3-D printer may be equipped with at least one print head, but more print heads may also be used. The used adhesive may be a conductive adhesive, such that the layer structures are formed by conductive metal powder and conductive adhesive for being electrically conductive. The adhesive may be cured by the use of the thermal treatment device, such as a heat lamp or a laser.

According to a further exemplary embodiment of the method, the wiring structure may be formed by at least one of the group consisting of selective laser melting, selective laser sintering, and electron beam melting.

According to a further exemplary embodiment, before consolidating (e.g. solidifying) the printing material the printing material is melted by a thermal treatment device, in particular a laser device. Instead of using an adhesive, the single layers are melted by means of a thermal treatment device, such as a laser, which is called selective laser sintering (SLS) or selective laser melting (SLM). Hence, metals, ceramics and sand may be used for SLS, SLM, or LENS. When the SLS, SLM, or method is used for manufacturing, the forming of the layer of the powder material is performed by means of a laser, wherein the laser melts or sinters the powder material for forming at least one layer of the wiring structure. When using SLM, SLM, or LENS manufacturing methods an adhesive for attaching the powder material may be obsolete.

Further, the powder may be melted by the use of a controllable electron beam, which will be called electron beam melting (EBM). This manufacturing process may allow to use materials comprising a higher melting point e.g. for melting also titanium materials.

According to a further exemplary embodiment of the method, the printing material may be applied by means of a material delivery nozzle. The printing material, e.g. the powder, is provided to the material delivery nozzle, such that the applied printing material may be spread out of the material delivery nozzle. A precise printing material amount may be delivered by the material delivery nozzle, such that only the wiring structure to be printed has to be covered with printing material instead of the whole component carrier or the whole layer structure.

According to a further exemplary embodiment, the method may further comprise moving the material delivery nozzle for forming a further layer of the wiring structure. The term "moving" may particularly denote a movement along at least one spatial direction for adjusting the material delivery nozzle with respect to the carrier body. For example, a distance between the carrier body and the material delivery nozzle may be adjusted. Furthermore, the material delivery nozzle may be moved along further spatial direction in order to adjust a desired alignment between the carrier body and the material delivery nozzle. Depending on the movement of the material delivery nozzle, the thickness and location of the layer to be formed is adjusted. This step may be repeated until the final thickness of the wiring structure is received such that the wiring structure is formed by spreading printing material layer by layer. The material delivery nozzle may be a nozzle used for LENS method, wherein the material is only locally delivered by the material delivery nozzle, i.e. on predetermined positions on the carrier body.

According to a further exemplary embodiment, before the printing material is applied on and/or in the carrier body the carrier body is provided into a material bed consisting of the printing material. The carrier body may be placed into the material bed. The component carrier may be completely covered by the printing material arranged inside the material bed. The carrier body may be adjusted in the material bed such that a surface of the carrier body, onto which the wiring structure should be formed, is arranged with a defined distance to a surface of the material bed. Hence, between the environment and the surface of the carrier body, a desired thickness of printing material is arranged. Next, by a treatment device as described below, which may be a thermal treatment device for applying thermal energy to the surface of the material bed or for radiating a predefined wavelength of light for photopolymerization to the surface of the material bed, consolidates (e.g. solidifies) the applied printing material between the surface of the material bed and the carrier body.

According to a further exemplary embodiment, the method may further comprise moving the carrier body for forming a further layer of the wiring structure. After the printing of a layer of the wiring structure on/in the carrier body may be moved. In particular, the carrier body is lowered about the thickness of the next layer of the wiring structure which should be printed.

According to a further exemplary embodiment of the method, the three-dimensionally printing may comprise arranging the carrier body in a container. After the arranging of the carrier body the fluid material is consolidated (e.g. solidified) by a treatment device, in particular a laser device, on and/or in the layer structures for forming at least one layer of the wiring structure. An ultraviolet laser may be used which is focused onto the container comprising the fluid material. The laser is used to consolidate (e.g. solidify) desired regions of the fluid material for forming the defined design of the wiring structure. The fluid material may be consolidated, in particular solidified and/or cured, and forms a single layer of the desired wiring structure. These steps can be repeated for each layer of the wiring structure. An elevator platform may be used to move the carrier body or the surface onto which the wiring structure is to be printed. The elevator may be moved about a distance which is equal to a thickness of a single layer of the structure into the container. Next, a blade may sweep over the consolidated (e.g. solidified) layer for providing a homogeneous distribution of the fluid material. Next, the laser consolidates (e.g. solidifies) further desired regions of the fluid material for forming the defined design of the wiring structure. The steps are repeated until the desired 3-D structure, i.e. the wiring structure, is achieved. After forming of the complete wiring structure the component carrier maybe further cured in an ultraviolet oven. This process may also be used with mixed materials such as ceramic and photopolymer mixtures. During this process also more than one laser may be used.

According to a further exemplary embodiment, the fluid material is a photosensitive material, in particular the fluid material may be photosensitive under the ultraviolet light of the laser. A further process using fluidic materials may be the multi-jet modelling, poly jet method. In this process of fluidic light-sensitive plastic is applied onto a platform by a printhead and is immediately cured by a light source (e.g. a laser or an UV lamp) integrated in the printhead.

According to a further exemplary embodiment, the method may further comprise a forming of an electronic circuit by the wiring structure on and/or in the layer structures. According to this embodiment, the 3-D printer may not only print the wiring structure but also the complete electronic circuit. The electronic circuit is built layer by layer using the respective 3-D printing method as described above for the wiring structures.

According to a further exemplary embodiment, forming the wiring structure may further comprise forming the wiring structure extending perpendicular with respect to a stacking direction of the plurality of layer structures. In other words the wiring structure may be formed along a plane extending in a direction parallel to the layer structures. The wiring structure may be formed on a surface of one of the plurality of layer structures. The wiring structure may also be formed on opposing surface of one of the plurality of layer structures. Further, the wiring structure may also be formed on surfaces of each of the plurality of layer structures. The wiring structure may extend between the plurality of layer structures. The wiring structure may extend along a direction of a plane parallel to the layer structure on at least one of the layer structures and/or also in (embedded) at least one of the layer structures.

According to a further exemplary embodiment, forming the wiring structure further comprises forming the wiring structures along a stacking direction of the plurality of layer structures. In other words, the wiring structure may be formed along a plane extending in a direction perpendicular to the layer structures. In contrast to the wiring structures extending in a direction parallel to the layer structures the wiring structure which extends along a plane extending in a direction perpendicular to the layer structures is extending through at least one of the plurality of layer structures. Further, the wire structure may extend through more than one of the plurality of layer structures.

According to a further exemplary embodiment, the method may further comprise forming a further wiring structure on and/or in the layer structures at least partially by three dimensionally printing. The further wiring structure may be formed on/in the same layer structure as the (first) wiring structure. The further wiring structure may be formed on/in a different layer structure than the (first) wiring structure. The wiring structure and the further wiring structure may be formed on opposing sides of at least one of the plurality of layer structures.

According to a further exemplary embodiment, the further wiring structure is formed extending perpendicular with respect to a stacking direction of the plurality of the layer structures. Hence, the further wiring structure and the first wiring structure may cross each other. In particular, the wiring structure and the further wiring structure may be electrically connected with each other. According a further exemplary embodiment, the method may further comprise forming at least a connecting wiring structure by three dimensionally printing for at least partially connecting the wiring structure and the further wiring structure.

According to a further exemplary embodiment, the wiring structure and the further wiring structure are arranged spaced apart from each other. The wiring structure and the further wiring structure may cross each other for forming a wiring path from a layer structure to another layer structure, wherein these layer structures are connected (for example electrically connected) by the wiring structure and the further wiring structure. In this embodiment, the connecting wiring structure may be the wiring structure located between the wiring structure and the further wiring structure and forming a connection of the wiring structure and the further wiring structure. Hence, a connection through a layer structure may be formed.

According to a further exemplary embodiment, the method may further comprise three dimensionally printing the wiring structure directly on and/or in at least one of the layer structures.

According to a further exemplary embodiment, the method may further comprise removing the respective layer structure at least partially by an etching process for forming a structured layer structure. When the wiring structure is printed directly on an electrically conductive layer structure this electrically conductive layer structure may be removed by the etching process. In particular, parts of the respective layer structure may be removed which are not covered by the wiring structure or which are not in contact with the wiring structure such that no undesired electrically conductive parts or lines remain. By printing the wiring structures on the respective layer structures, the standard plating (galvanic) process may be obsolete. Further, the etching chemical used for the etching process may be chosen in such a manner that only the desired material, e.g. the material from the respective layer structure and not the wiring structure, may be removed. By using this method, an embedded trace substrate may be formed by three dimensionally printing. Therefore, a copper foil may be 3D printed, on which a dielectric may also be 3D printed, wherein the embedded trace substrate may be 3D printed in the dielectric (wherein before printing the embedded trace substrate in the dielectric respective cavities may be formed for receiving the embedded trace substrate(s)). On top of the embedded trace substrate a further copper foil may also be 3D printed such that the embedded trace substrate is embedded in the dielectric and between the copper foils. According to this embodiment it may also be possible that only the respective copper foils are 3D printed and the formation of the embedded trace substrate may be formed by an galvanic plating and etching process, or vice versa.

According to a further exemplary embodiment, the material of the wiring structure and the material of the at least one layer structure to which the wiring structure is directly printed differ from each other. For example the wiring structure may be made of copper and the at least one layer structure may be made of another electrically conductive metal or the at least one layer structure may be made of an insulating material like plastic. When using different materials for the at least further layer structure the etching chemical may be chosen in such a manner that only the material of the at least one layer structure is removed and the copper wiring structure remains.

According to a further exemplary embodiment, the method may further comprise forming a wiring structure by three dimensionally printing on a foil, in particular a conductive foil, and subsequently attaching the foil to at least one of the layer structures. The wiring structure is firstly printed to the foil and afterwards arranged on/in the layer structures together with the foil. The foil may be attached to at least one of the layer structures in such a manner that the wiring structure on the foil is in contact with the at least one of the layer structures. It may also be possible that the foil is attached in such manner that the foil is arranged between the wiring structure and the at least one of the layer structures.

According to a further exemplary embodiment, the method may further comprise attaching the wiring structure to a recess formed in at least one of the layer structures such that the foil covers the wiring structure. When the foil covers the wiring structure, the wiring structure may be formed on the at least one of the layer structures such that the wiring structure is arranged between the foil and the at least one of the layer structure. The recess may be formed by drilling, milling or etching after the forming of the at least one of the layer structures.

According to a further exemplary embodiment, the method may further comprise enclosing the wiring structure with resin. Further, the method may further comprise enclosing at least one of the wiring structure, the further wiring structure and the connecting wiring structure with resin. In particular, the enclosing with resin may be carried out by means of three dimensionally printing. According to a further exemplary embodiment, the method may further comprise enclosing the carrier body on at least one side of the carrier body with a further layer structure comprising at least one material component of the group consisting of aluminum, copper, steel, titanium. The enclosing of the carrier body may form a shell or a hull of the carrier body, such that the carrier body may be protected from the surrounding by mechanical stress or it may function as an electromagnetic shielding.

It has to be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless other notified, in addition to any combination of features belonging to one type of subject matter also any combination between features relating to different subject matters, in particular between features of the apparatus type claims and features of the method type claims is considered as to be disclosed with this document.

BRIEF DESCRIPTION OF THE DRAWINGS

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF ILLUSTRATED EMBODIMENTS

Figure 1:
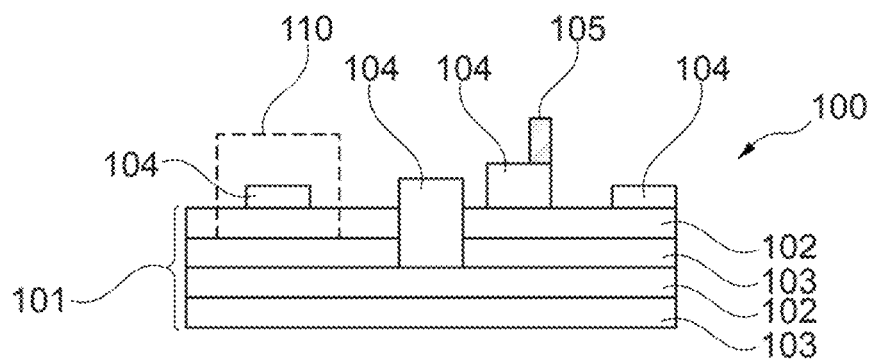
FIG. 1 shows a component carrier according to an exemplary embodiment of the invention.

The illustrations in the drawings are schematically presented. It is noted that in different figures similar or identical elements are provided with the same reference signs.

FIG. 1 shows a component carrier 100, wherein the component carrier 100 comprises a carrier body 101. The carrier body 101 comprises a plurality of electrically conductive layer structures 102 and/or a plurality of electrically insulating layer structures 103. The component carrier 100 further comprises a wiring structure 104 on and/or in the layer structures 102, 103, wherein the wiring structure 104 is at least partially formed as a three dimensionally printed structure. In this embodiment, the carrier body comprises at least two conductive layer structures 102 and at least two insulating layer structures 103, wherein the conductive layer structures 102 and the insulating layer structures 103 are arranged in an alternating manner. On the top conductive layer structure 102 wiring structures 104 are arranged. Further, at least one further wiring structure 104 is arranged on the top conductive layer structure 102 in such a manner that the wiring structure 104 extends through the top conductive layer structure 102 and further through the uppermost insulating layer structure 103, such that it is arranged on a further conductive layer structure 102.

The component carrier 100 further comprises a component 110 mounted on and/or embedded in the carrier body 101. In FIG. 1 the component 110 is illustrated schematically with dashed lines and is arranged on the top conductive layer structure 102. For example, the component 110 extends into the carrier body 101 (in particular extends through the uppermost conductive layer structure 102). As can be seen in FIG. 1, the component carrier 100 is shaped as a plate. In particular, the component carrier 100 is configured as a laminate tape component carrier 100 comprised of the plurality of layer structures 102, 103.

The wiring structure 104 at the left of the carrier body 101 may form an electronic connection with the electronic component 110.

In FIG. 1 it is illustrated such that the wiring structure 104 has a rectangular shape. The wiring structure 104 may also have varying cross sections. The wiring structure 104 which extends into the carrier body 101 is formed on opposing surfaces of at least one of the plurality of layer structures 102, 103, in particular the wiring structure 104 is formed on opposing surfaces of the uppermost conductive layer structure 102. The wiring structure 104 may comprise different cross section in a stacking direction of the plurality of layer structures 102, 103 and/or perpendicular with respect to a stacking direction (i.e. along a surface) of the plurality of the layer structures 102, 103.

Further, the wiring structure 104 comprises a protrusion 105 which may form an electrical contact. For example, the protrusion 105 extends from a section of a wiring structure 104. The wiring structures 104 may be at least partially surrounded by an encapsulation, wherein the protrusion 105 extends through the encapsulation for forming an electrical contact. In FIG. 1, the one of the wiring structures 104 extends through two layer structures 102, 103.

Figure 2:
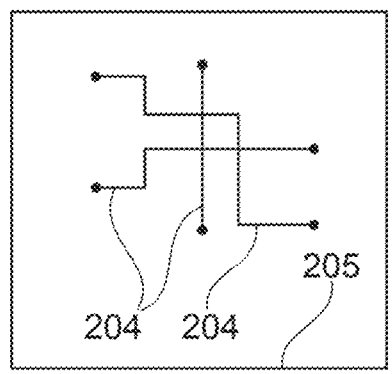
FIG. 2 shows at least one wiring structure according to an exemplary embodiment of the invention.

FIG. 2 shows a plurality of wiring structures 204, wherein the plurality of wiring structures 204 are forming an electronical circuit. The wiring structures 204 are formed on a respective layer structure forming a printing surface 205.

Figure 3:
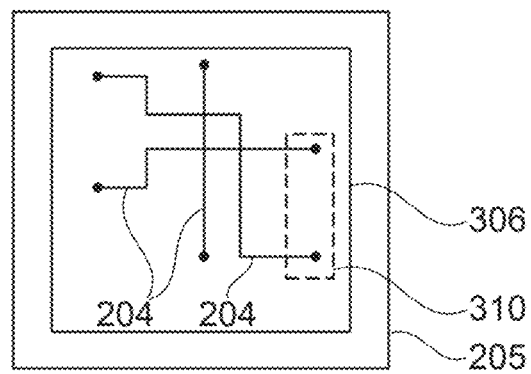
FIG. 3 shows another at least one wiring structure according to an exemplary embodiment of the invention.

FIG. 3 shows the plurality of wiring structures 204 from FIG. 2, wherein the wiring structures 204 are coupled to a component 310. An encapsulant, such as resin, i.e. a dielectric, may enclose the wiring structures 204. The dielectric may be applied onto the wiring structures 204 by casting or injection molding.

Figure 4:
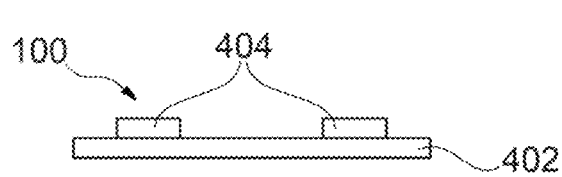
FIG. 4 shows a step of a forming of a component carrier according to an exemplary embodiment of the invention.

FIG. 4 shows the step of manufacturing a component carrier 100, wherein on top of a conductive layer structure 402 wiring structures 404 are formed by 3-D printing. At least one of the plurality of the electronically conductive layer structures 402 is a copper layer (e.g. a copper foil). The wiring structure 404 is formed from at least one material of the group consisting of copper, aluminum, steel, and titanium.

Figure 5:
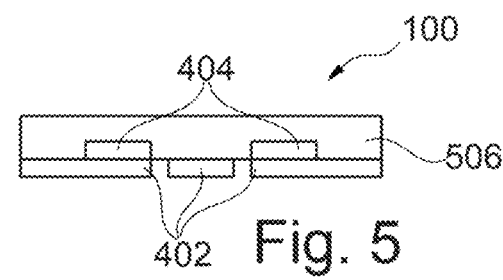
FIG. 5 shows a further step of reforming of a component carrier according to an exemplary embodiment of the invention.

FIG. 5 shows a further step of manufacturing a component carrier 100, wherein the step shown in FIG. 4 has already been carried out. Above of the wiring structures 404 an encapsulation or encapsulant 506 is applied. The encapsulation 506 may be resin which provides an electrical insulating structure 506 of the component carrier 100. The copper foil 402 covers the wiring structure 404 at least partially. The copper foil 402 may be structured by means of an etching process, wherein defined sections of the copper layer 402 are removed. Afterwards, further wiring structures 404 may be formed by 3-D printing on the etched copper layer structure. Next, a further encapsulation with resin may be provided. The steps may be repeated until the desired component carrier 100 with the desired amount of electrically conductive layer structures 402 and electrically insulating layer structures 506 is received.

Figure 6:
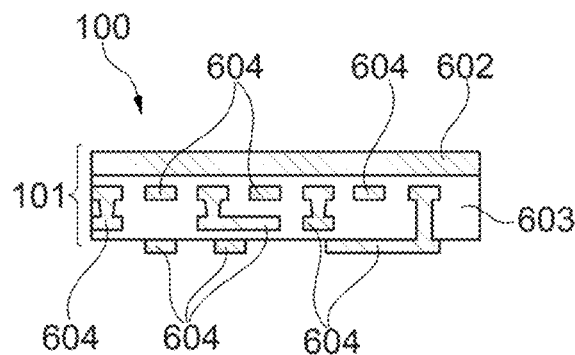
FIG. 6 shows a component carrier according to an exemplary body meant of the invention.

FIG. 6 shows a component carrier 100 according to an exemplary embodiment of the invention. The component carrier 100 comprises a carrier body 101 having a conductive layer structure 602 and an insulating layer structure 603. In the insulating layer structure 603 wiring structures 604 having different sizes are formed. As can be seen in FIG. 6, the wiring structures 604 extend in directions parallel and perpendicular with respect to a stacking direction of the layer structures 602, 603.

The shown component carrier 100 may be formed as follows. On the conductive layer 602, a first insulating layer structure 603 may be formed, wherein forming the first insulating layer structure 603 may be conducted by means of 3-D printing. In the next step, first wiring structures 604 (which in FIG. 6 are the top wiring structures 604 being arranged in parallel with the conductive layer structure 602 and are arranged in the FIG. 6 below the conductive layer structure 602) are formed on the insulating layer structure 603 by 3-D printing. Further, further wiring structures 604 which extend perpendicular to the layer structures 602, 603 are formed on the first wiring structures 604. Next, the wiring structures 604 (i.e. the first wiring structures and the wiring structures extending perpendicular to the layer structures 602, 603) are enclosed by an insulating layer structure 603. The insulating layer structure 603 may be the same layer structure onto which the first wiring structures 604 is formed. The wiring structures 604 are partially covered by the insulating layer structure 603, because further wiring structures 604 may be provided on top of the enclosing insulating layer structure 603 and simultaneously on top of the wiring structure 604 extending along a stacking direction of the layer structures 602, 603. Hence, a connection (for example an electrical connection) of the wiring structure 604 is provided. Alternatively, a top layer of wiring structures 604 may be formed by an etching process. The etching process may be conducted in a conventionally manner, wherein a specific region of a layer of conductive material or insulating material is removed by means of etching.

Figure 7:
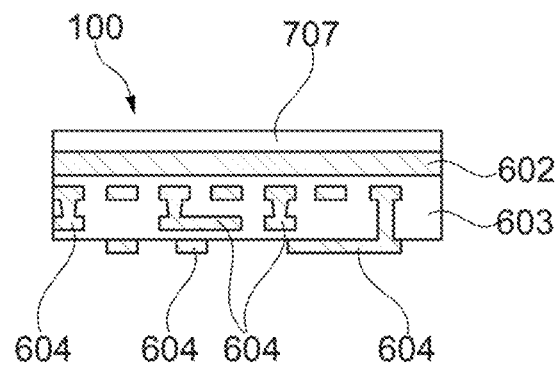
FIG. 7 shows a further component carrier according to an exemplary embodiment of the invention.

FIG. 7 shows the component carrier 100 according to FIG. 6, which further comprises a top layer 707 made of metal, like titanium, steel or aluminum. The further metal layer 707 may be used for covering the component carrier 100 from the surrounding ambient.

Figure 8A:
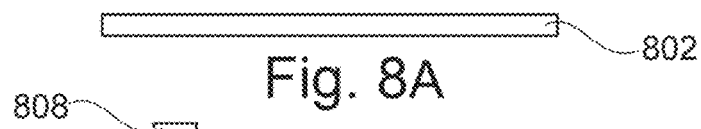
FIG. 8A, FIG. 8B and FIG. 8C show a manufacturing step of a component carrier according to an exemplary embodiment of the invention.
Figure 8B:
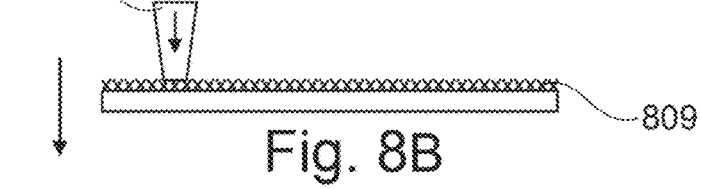
Figure 8C:

FIG. 8A to 8C shows a method for manufacturing a component carrier 100 according to an exemplary embodiment of the invention. A conductive layer structure 802, such as a copper foil, is provided. The copper foil may have thickness in a range of 1 μm (Micrometer) to 500 μm. At least one wiring structure 804 is formed on the copper foil by 3-D printing. The wiring structure 804 is 3-D printed by means of e.g. a powder material 809. The powder material 809 is applied on the conductive layer structure 802 and a laser 808 is used for melting or sintering the powder material. The melted powder material 809 forms a first layer of the wiring structure 804. Next, a further layer of powder material 809 is applied on the first layer of the wiring structure 804 and the laser 808 again melts or sinters the powder material for forming a further layer of the wiring structure 804. The steps may be repeated until the desired thickness of the wiring structure 804 is obtained. Due to this method, wiring structures 804 comprising different thicknesses can be provided on the copper foil 802. The wiring structure may form copper tracks or copper pads on the copper foil. The step of melting the powder material 809 may also be conducted using an electron beam.

Figure 9A:
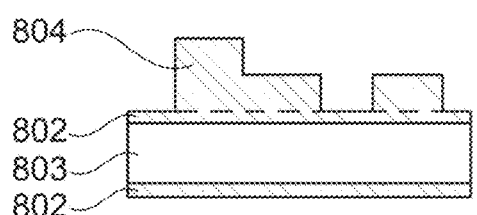
FIG. 9A and FIG. 9B show a further manufacturing step of a component carrier according to an exemplary embodiment of the invention.
Figure 9B:
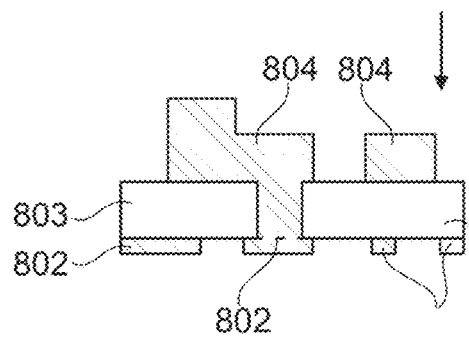

FIGS. 9A and 9B show a method of manufacturing a component carrier 100 according to a further exemplary embodiment, wherein the wiring structures 804 are formed on a copper foil 802 as described in FIGS. 8A, 8B, 8C. The insulating layer structure 803 is formed on the side of the copper foil 802 which is arranged opposed with respect to the wiring structures 804. The insulating layer structure 803 may be a dielectric. A further copper foil 802 is laminated to the insulating layer structure (i.e. dielectric) 803. After the laminating, the copper foils 802 on the opposing sides of the insulating layer structure 803 undergo a photo structuring and etching process. After the etching process, the desired structures remain as shown in the lower portion of FIG. 9B.

Figure 10A:
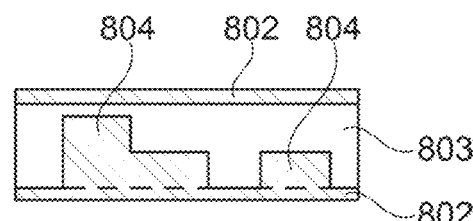
FIG. 10A and FIG. 10B show another one affect except of a component carrier according to an exemplary embodiment of the invention.
Figure 10B:
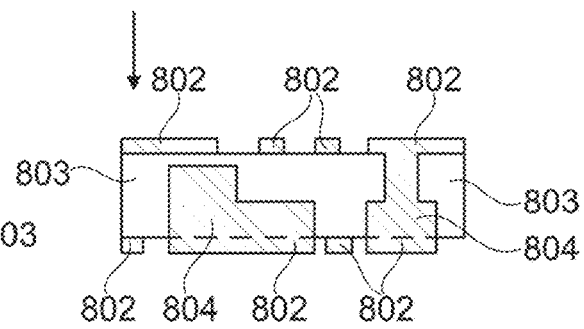

FIGS. 10A and 10B show alternative steps of a method of manufacturing a component carrier 100 compared to FIGS. 9A, 9B, wherein the wiring structures 804 are formed on a copper foil 802 as described in FIGS. 8A, 8B, 8C. The wiring structures 804 are enclosed with an insulating layer structure 803 such that the wiring structures are completely covered by the insulating layer structure 803. Further, a further copper foil 802 is formed on the insulating layer structure 803, wherein the further copper foil 802 is arranged at the side of the insulating layer structure 803 opposing the copper foil 802 comprising the wiring structures 804. After the step of laminating, the copper foils 802 on the opposing side of the insulating layer structure 803 also undergo a photo structuring and etching process for forming the desired component carrier 100. The insulating layer structure 803 may be a dielectric. As can be taken from FIG. 10B, the wiring structure 804 which extends along a stacking direction of the copper foils 802 and the insulating layer structure 803 is formed after the lamination. The wiring structure 804 extending perpendicular to the layer structures 802, 803 may also be formed by means of 3-D printing. In particular, for forming the wiring structure 804 (extending perpendicular), a hole is drilled through the laminated layer structures 802, 803. After the hole is drilled, the wiring structure 804 is formed by means of 3-D printing inside the drilled hole. On the other hand, the 3D printing inside the drilled hole may be changed to a hole filling process by galvanic plating and/or hole filling PCB process depending on the complexity of the manufacturing process of the component carrier.

Figure 11:
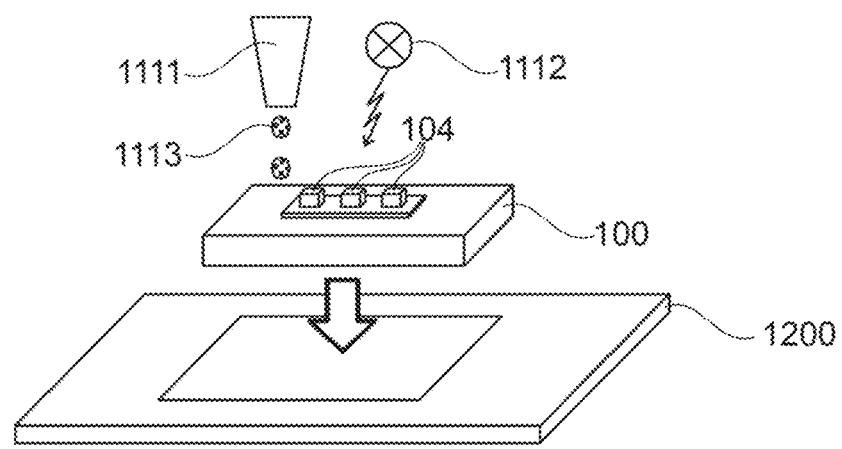
FIG. 11 shows a method for manufacturing a component carrier according to an exemplary embodiment of the invention.

FIG. 11 shows a method for manufacturing a component carrier 100 according to an exemplary embodiment of the invention. A further component carrier 1200 is provided, wherein the further component carrier 1200 can be manufactured using one of the above described methods. The further component carrier 1200 (e.g. a printed circuit board) comprises a component carrier 100, wherein the component carrier 100 is integratable to the further component carrier 1200. The component carrier 100 is directly printed on/in the further component carrier 1200. The further component carrier 1200 provides the surface on/in which the component carrier 100 is to be formed by means of 3-D printing. Hence, both component carriers 100 and 1200 may be manufactured by 3D printing, wherein the (smaller) component carrier 100 is placed on/in the (larger) further component carrier 1200. An application device, like a printhead 1111 (which may also be a material delivery nozzle) comprises the printing material 1113. The printing material 1113 is ejected by the printhead 1111 for forming the component carrier 100 on/in the further component carrier 1200. Hence, the component carrier 100 is printed on/in the further component carrier 1200 by using printing material 1113. A treatment device 1112, in particular laser device, radiates a laser beam for treating the printing material 1113, e.g. for melting or sintering, the printing material, e.g. powder material, for forming a consolidated (e.g. solidified) three dimensionally printed structure. It may also be possible, that the printhead 1111 functions as an extruder, such that melted printing material 1113 is ejected to a desired location.

It should be noted that the term "comprising" does not exclude other elements or steps and "a" or "an" does not exclude a plurality. Also elements described in association with different embodiments may be combined.

LIST OF REFERENCE SIGNS 100 component carrier
101 carrier body
102 conductive layer structure
103 insulating layer structure
104 wiring structure
105 protrusion
110 component
205 printing surface
306 encapsulating
310 component
402 conductive layer structure
506 encapsulating
602 conductive layer structure
603 insulating layer structure
604 wiring structure
707 metal layer structure
802 conductive layer structure
803 insulating layer structure
804 wiring structure
808 laser
809 powder material
1200 further component carrier
1111 printhead
1112 treatment device
1113 printing material

The invention claimed is:

1. A component carrier, comprising:
a carrier body comprising a plurality of electrically conductive layer structures and at least one electrically insulating layer structure which layer structures are stacked above each other in a stacking direction; and
a wiring structure being at least partially formed as a three-dimensionally printed structure,
wherein one of the plurality of electrically conductive layer structures comprises a conductive foil formed on an external surface of the at least one electrically insulating layer structure of the carrier body such that the conductive foil covers the wiring structure;
wherein the wiring structure is formed on the conductive foil
and extends from the conductive foil into the carrier body such that the wiring structure is laterally enclosed by the at least one electrically insulating layer structure,
wherein the wiring structure has a varying height in the stacking direction,
wherein the wiring structure comprises a powder material.

2. The component carrier according to claim 1, further comprising:
a component mounted on and/or embedded in the carrier body.

3. The component carrier according to claim 2, wherein the wiring structure is configured to form an electronic and/or thermal connection with the electronic component.

4. The component carrier according to claim 2, wherein the component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip.

5. The component carrier according to claim 1, wherein the wiring structure comprises at least one protrusion for forming an electrical and/or thermal contact, wherein the protrusion extends through the at least one electrically insulating layer structure to a second conductive foil for forming an electrical contact.

6. The component carrier according to claim 1, comprising at least one of the following features:
wherein a cross section of the wiring structure perpendicular to a current propagation direction has a shape of at least one of the group comprising a rectangular shape, a fractal shape, a circular shape, an oval shape and an trapezoid shape,
wherein the wiring structure formed extends along a stacking direction of the plurality of layer structures, wherein the wiring structure extends perpendicular with respect to a stacking direction of the plurality of layer structures.

7. The component carrier according to claim 1, wherein a cross section of the wiring structure perpendicular to a current propagation direction has a shape of at least one of an L-shape, a U-shape and a comb-shape.

8. The component carrier according to claim 1, comprising at least one of the following features:
   wherein the wiring structure comprises different cross sections in a stacking direction of the plurality of layer structures and/or perpendicular with respect to a stacking direction of the plurality of layer structures,
   wherein the wiring structure is formed from at least one material component of the group consisting of copper, aluminum, steel, and titanium,
   wherein the wiring structure is formed on opposing surfaces of at least one of the layer structures,
   wherein the wiring structure is directly printed on at least one of the plurality of the layer structures,
   wherein at least one of the layer structures comprises a recess,
   wherein the wiring structure is arranged in the recess.

9. The component carrier according to claim 1, comprising at least one of the following features:
   the at least one electrically conductive layer structure comprises at least one of the group consisting of copper, aluminum, nickel, silver, gold, palladium, and tungsten, any of the mentioned materials being coated with supra-conductive material such as graphene,
   the at least one electrically insulating layer structure comprises at least one of the group consisting of resin, reinforced or non-reinforced resin, epoxy resin, Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide,
   the component carrier is shaped as a plate,
   the component carrier is configured as one of the group consisting of a printed circuit board, and a substrate, arranged as a laminate-type component carrier.

10. A method of manufacturing a component carrier, comprising:
    providing a carrier body comprising a plurality of electrically conductive layer structures and at least one electrically insulating layer structure;
    forming a wiring structure at least partially by three-dimensionally printing; and
    forming a conductive foil on at least one external surface of the at least one electrically insulating layer structure of the carrier body such that the conductive foil covers the wiring structure;
    wherein the wiring structure extends from the conductive foil into the carrier body such that the wiring structure is enclosed by the at least one electrically insulating layer structure and has a varying height in the stacking direction,
    wherein the wiring structure comprises a powder material.

11. The method according to claim 10, wherein the three-dimensionally printing comprises:
    applying a printing material to an application device,
    melting the printing material in the application device,
    applying the melted printing material in the layer structures for forming at least one layer of the wiring structure,
    consolidating the applied printing material for forming at least one layer of the wiring structure wherein the wiring structure is formed by at least one of the group consisting of selective laser melting, selective laser sintering, and an electron beam,
    wherein before consolidating the printing material the printing material is melted by a thermal treatment device,
    wherein the printing material is applied by a material delivery nozzle,
    wherein the method further comprises moving the material delivery nozzle for forming a further layer of the wiring structure.

12. The method according to claim 11, wherein before the printing material is applied in the carrier body, the carrier body is moved into a material bed consisting of the printing material.

13. The method according to claim 11, further comprising:
    moving the carrier body for forming a further layer of the wiring structure.

14. The method according to claim 10, the method further comprising:
    arranging the carrier body in a container,
    wherein the three-dimensionally printing further comprises:
    providing a consolidatable fluid material in the container,
    consolidating the fluid material by a treatment device in the layer structures for forming at least one layer of the wiring structure,
    wherein the fluid material is a photosensitive material,
    moving the carrier body for forming a further layer of the wiring structure,
    forming a further wiring structure on and/or in the layer structures at least partially by three dimensionally printing,
    wherein the further wiring structure is formed extending perpendicular with respect to a stacking direction of the plurality of layer structures,
    forming at least a connecting wiring structure for at least partially connecting the wiring structure and the further wiring structure by three dimensionally printing,
    wherein the wiring structure and the further wiring structure are arranged spaced apart from each other.

15. The method according to claim 10, further comprising:
    three dimensionally printing the wiring structure directly in at least one of the layer structures,
    removing the respective layer structure at least partially by an etching process for forming a structured layer structure,
    wherein the material of the wiring structure and the material of the at least one electrically conductive layer structure to which the wiring structure is directly printed differ from each other,
    forming a wiring structure by three dimensionally printing on a conductive foil, and subsequently
    attaching the conductive foil to at least one of the layer structures, and
    attaching the wiring structure to a recess formed in at least one of the layer structures such that the foil covers the wiring structure.

16. The method according to claim 10, further comprising at least one of the following features:
    enclosing the wiring structure with resin, and
    enclosing the carrier body on at least one side of the carrier body with a further layer structure comprising at least one material component of the group consisting of aluminum, copper, steel, and titanium.

\* \* \* \* \*